(12) United States Patent
Lee

(10) Patent No.: US 7,868,661 B2
(45) Date of Patent: *Jan. 11, 2011

(54) LINE DRIVING CIRCUIT OF SEMICONDUCTOR DEVICE

(75) Inventor: Dong Uk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/169,085

(22) Filed: Jul. 8, 2008

(65) Prior Publication Data

US 2008/0265943 A1    Oct. 30, 2008

Related U.S. Application Data

(63) Continuation of application No. 11/451,098, filed on Jun. 12, 2006, now Pat. No. 7,446,569.

(30) Foreign Application Priority Data

Jun. 10, 2005    (KR) .................. 10-2005-0049774

(51) Int. Cl.
*H03K 19/094*    (2006.01)
(52) U.S. Cl. ......................................... 326/83; 326/87
(58) Field of Classification Search .............. 326/82–87; 327/108–109
See application file for complete search history.

(56) References Cited

U.S. PATENT DOCUMENTS

| 4,888,498 | A | * | 12/1989 | Kadakia | ...................... 327/546 |
| 5,952,847 | A | * | 9/1999 | Plants et al. | ................... 326/80 |
| 2003/0132779 | A1 | * | 7/2003 | Yoo et al. | ...................... 326/81 |

* cited by examiner

*Primary Examiner*—Rexford N Barnie
*Assistant Examiner*—Thienvu V Tran
(74) *Attorney, Agent, or Firm*—Ladas & Parry LLP

(57) ABSTRACT

Disclosed is a line driving circuit which includes two NMOS transistors in series between a supply voltage and a ground voltage. The output of the line driving circuit is applied to an interior circuit through a transmission line, and a repeater is used when the transmission line is long.

7 Claims, 4 Drawing Sheets

LINE DRIVING CIRCUIT OF SEMICONDUCTOR DEVICE

BACKGROUND OF THE INVENTION

1. Field of the Invention

The present invention relates to a line driving circuit of a semiconductor device, and more particularly to a line driving circuit for reducing the swing width of a transmission signal.

2. Description of the Prior Art

As generally known in the art, data transmission between interior circuits in a semiconductor device is achieved through transmission lines connected between the interior circuits.

A line driving circuit generally refers to a circuit for transmitting data (or signals) from an interior circuit to another interior circuit through a transmission line.

Hereinafter, a line driving circuit will be described with reference to FIGS. 1A and 1B.

FIG. 1A is a block diagram illustrating a state in which different interior circuits are connected to each other through transmission lines, and FIG. 1B is a circuit diagram illustrating the last circuit of an interior circuit shown in FIG. 1A.

As shown in FIG. 1B, typically, the last circuit of an interior circuit includes an amplification unit and drivers. Herein, the amplification unit may include a differential amplifier or the like, and each of the drivers 11 and 12 typically includes a CMOS inverter or the like. In FIG. 1B, "CLK_LATCH" represents an enable signal, "in" and "inb" represent signals applied to the amplification unit, and "out1" and "out1$b$" represent output signals of the amplification unit. Also, "out" represents the output node of an interior circuit shown in FIG. 1A, and is connected to a transmission line.

In operation, a signal applied to the amplification unit is amplified by the differential amplifier, and then is applied to the drivers 11 and 12 via inverters. The drivers 11 and 12 transmit the VDD and the ground voltage to an interior circuit through a transmission line connected to the output node 'out'. Therefore, the signal transmitted through the transmission line is a signal swinging fully between the voltage of VDD and the ground voltage.

Herein, the power of a signal transmitted through the transmission line is expressed as the following equation.

$$P = (1/2) * C * VDD * VDD * f * N$$

Herein, 'P' represents a power, 'C' represents the capacitance of a transmission line, 'VDD' represents a supply voltage, 'f' represents the frequency of a transmission signal, and 'N' represents the number of transmission lines.

However, when a typical CMOS-type inverter driver is used as a line driving circuit as described with reference to FIG. 1, a signal transmitted through a transmission line swings fully between the VDD and the ground voltage, so that power consumption required in the transmission line increases.

SUMMARY OF THE INVENTION

Accordingly, the present invention has been made to solve the above-mentioned problems occurring in the prior art, and an object of the present invention is to provide a circuit for reducing power consumption of a transmission line.

In addition, another object of the present invention is to provide a line driving circuit for transmitting a signal through a transmission line by reducing a swing width of the signal.

In order to accomplish this object, there is provided a line driving circuit of a semiconductor device, the line driving circuit comprising: a first NMOS transistor connected between a supply voltage and a first node; a second NMOS transistor connected between the first node and ground; and a differential amplification unit for generating first and second output signals to be applied to the gates of the first and second NMOS transistors, respectively, wherein the first and second output signals have a complementary relationship, and the first and second output signals have a voltage level corresponding to a level of the supply voltage or a ground voltage.

Herein, the first node is connected to an input node of an interior circuit in the semiconductor device by means of a transmission line.

Preferably, the line driving circuit further comprises a receiver, which receives a signal outputted through the first node and converts a voltage level of the received signal.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
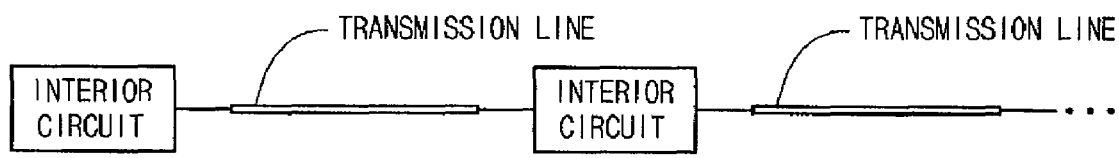
FIGS. 1A and 1B are block diagrams for explaining a conventional line driving circuit.
Figure 1B:
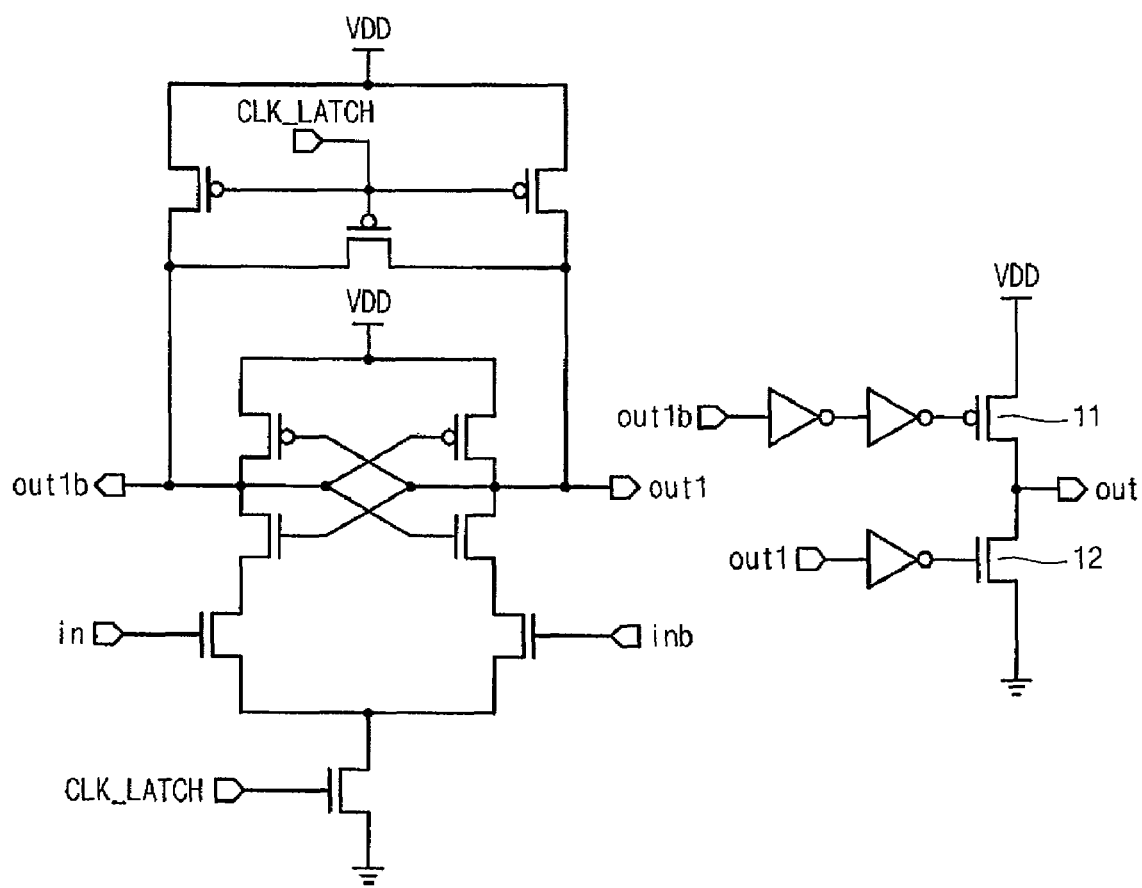

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
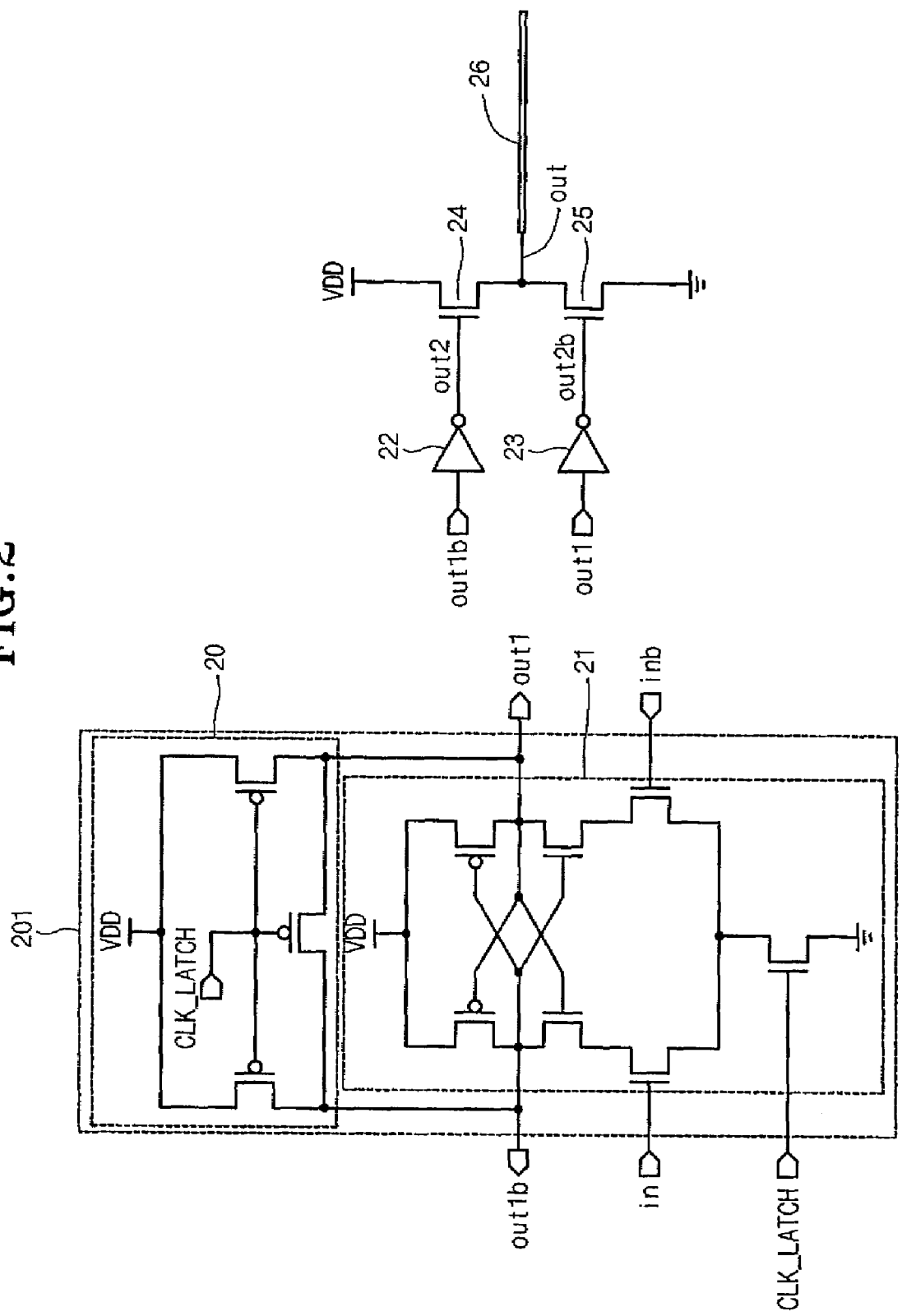
FIG. 2 is a circuit diagram illustrating a configuration of a line driving circuit according to an embodiment of the present invention.

FIG. 2 is a circuit diagram illustrating a configuration of a line driving circuit of a semiconductor device according to an embodiment of the present invention.

The line driving circuit shown in FIG. 2 includes, buffers 22 and 23 for receiving output signals of an amplification unit 201, and drivers 24 and 25 controlled by output signals of the buffers 22 and 23. For reference, the core of the line driving circuit is the drivers 24 and 25, and the amplification unit 201 and buffers 22 and 23 may be replaced with typical inverters or the like. That is, the amplification unit 201 and buffers 22 and 23 are only a secondary circuit for exposing the characteristics of the drivers 24 and 25. Therefore, the secondary circuit may be modified into or replaced with a different circuit.

As shown in FIG. 2, the amplification unit 201 includes a precharge section 20 and a differential amplifier 21.

The precharge section 20 sets the output nodes 'out1' and 'out1$b$' of the differential amplifier 21 to a high level while the differential amplifier 21 is not operating.

After the differential amplifier 21 receives signals outputted from an interior circuit (not shown) through input nodes 'in' and 'inb', the differential amplifier 21 amplifies and outputs the received signals through its output nodes 'out1' and 'out1$b$'.

A control signal 'CLK_LATCH' applied commonly to both the precharge section 20 and differential amplifier 21 is an enable signal. When the control signal 'CLK_LATCH' has a high level, only the differential amplifier 21 is enabled, and when the control signal 'CLK_LATCH' has a low level, only the precharge section 20 is enabled. For reference, that the precharge section 20 is enabled refers to a case in which a semiconductor device including the line driving circuit shown in FIG. 2 enters a waiting state (precharge state). For example, a precharge mode of a memory device is included in this case.

Since the above-mentioned amplification unit 201 is driven by the supply voltage 'VDD' of the semiconductor device, data (or signals) outputted through the output nodes 'out1' and 'out1b' swings fully between the supply voltage 'VDD' and the ground.

The output nodes 'out1' and 'out1b' of the amplification unit 201 are connected to the input nodes of the buffers 22 and 23. To be specific, the input node of the buffer 22 is connected to the output node 'out1b' of the amplification unit 201, and the input node of the buffer 23 is connected to the output node 'out1' of the amplification unit 201. The buffers 22 and 23 include inverters, and use the supply voltage 'VDD' as a driving voltage. Therefore, data (or signals) outputted from the buffers 22 and 23 swing fully between the supply voltage 'VDD' and the ground. For example, the output signal 'out2' of the buffer 22 has a voltage level of 'VDD' when the output signal 'out2' is at a high level, and the output signal 'out2' of the buffer 22 has a voltage level of the ground when the output signal 'out2' is at a low level.

The drivers 24 and 25 include two NMOS transistors connected in series to each other between the supply voltage 'VDD' and the ground.

The driver 24 is a pull-up driver, which outputs a voltage of 'VDD−Vth' through an output node 'out' when it is turned on, in which 'Vth' represents the threshold voltage of the driver 24. Such an output voltage (VDD−Vth) is different from the output voltage (VDD) of the prior art. According to the prior art, the PMOS transistor is used as the pull-up driver so that the output voltage "VDD" is generated when the pull-up driver is turned on. Herein, the output node 'out' is connected to a data transmission line 26, and the data transmission line 26 is connected to another interior circuit (not shown).

The driver 25 is a pull-down driver, which outputs the ground voltage through the output node 'out' when it is tuned on.

As shown in FIG. 2, according to an embodiment of the present invention, each of the pull-up driver and pull-down driver consists of an NMOS transistor. Therefore, differently from the prior art, the final output signal 'out' of the line driving circuit according to present invention has a reduced swing width of 'VDD−Vth' to '0V'. In addition, the amount of driving charge is C*(VDD−Vth), so that current is reduced. Therefore, differently from the prior art, the power consumed by a data transmission line in the present invention is reduced as follows.

$$P=(\tfrac{1}{2})*C*VDD*(VDD-Vth)*f*N$$

Herein, 'P' represents a power, 'C' represents the capacitance of a transmission line, 'VDD' represents a supply voltage, 'Vth' represents the threshold voltage of an NMOS transistor, 'f' represents the frequency of a transmission data, and 'N' represents the number of transmission lines. FIG. 2 shows a case of N=1.

Recent semiconductor devices (e.g., memory devices) use a supply voltage equal to or less than 1.8V. Therefore, it can be understood that the line driving circuit according to the present invention can provide a power reduction effect of approximately 30%, as compared with the prior art. In addition, it can be understood that as the supply voltage 'VDD' decreases to a level below 1.8V, the power reduction effect increases.

Generally, data passing through the data transmission line 26 passes a receiver before being transmitted to another interior circuit. Herein, the receiver receives data, which has been transmitted through the data transmission line and thus has a reduced swing width, and converts the received data into data swinging fully between the supply voltage and the ground voltage. That is, the data received by the receiver is converted into full swing data and is then applied to an interior circuit connected to the receiver.

However, when a typical inverter is used as the receiver in order to receive the data, which has been transmitted through the data transmission line 26 shown in FIG. 2 and thus has a reduced swing width, static current may occur. This is because, when data having a high level of approximately 1.2V is applied to the receiver consisting of an inverter (e.g., a CMOS inverter) through the data transmission line, not only the NMOS transistor is turned on, but also the PMOS transistor may shift into the conductive state.

Therefore, the present invention proposes a new receiver.

Figure 3:
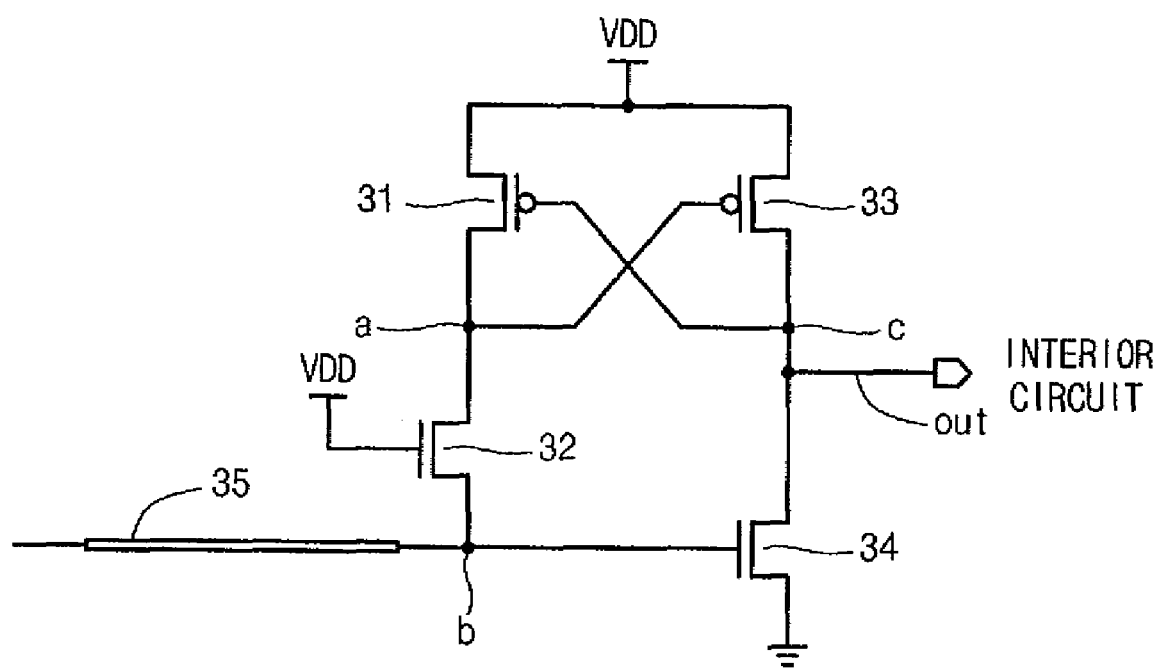
FIG. 3 is a circuit diagram illustrating a configuration of a receiver according to an embodiment of the present invention.

FIG. 3 is a circuit diagram illustrating a configuration of a receiver according to an embodiment of the present invention.

The receiver shown in FIG. 3 includes a PMOS transistor 31 connected between a supply voltage 'VDD' and node 'a', an NMOS transistor 32 connected between node 'a' and node 'b', a PMOS transistor 33 connected between a supply voltage 'VDD' and node 'c', and an NMOS transistor 34 connected between node 'c' and the ground. In addition, as shown in FIG. 3, the gate of the PMOS transistor 31 is connected to node 'c', the gate of the PMOS transistor 33 is connected to node 'a', the gate of the NMOS transistor 32 is connected to the supply voltage 'VDD', node 'b' is connected to the gate of the NMOS transistor 34 is connected, a transmission line 35 is connected to node 'b', and node 'c' is the output node 'out' of the receiver. Herein, the transmission line 35 corresponds to the transmission line 26 shown in FIG. 2. The output node 'out' of the receiver is connected to an interior circuit of a semiconductor device, which uses a full swing data (or signal) outputted from the receiver.

In operation in the receiver shown in FIG. 3, when a signal of a high level 'VDD−Vth' is applied through the transmission line 35, the transistor 34 is turned on. Accordingly, the ground voltage is outputted through the output node 'out'.

In contrast, a signal of the ground level is applied through the transmission line 35, the transistor 34 is turned off and the transistor 32 is turned on. Accordingly, the transistor 33 is turned on, and thus the supply voltage 'VDD' is outputted through the output node 'out'.

As shown in FIG. 3, since the transistors 31 to 34 are connected to form a latch structure, static current does not flow. Consequently, it is possible to prevent electric power from being unnecessarily consumed.

Figure 4:
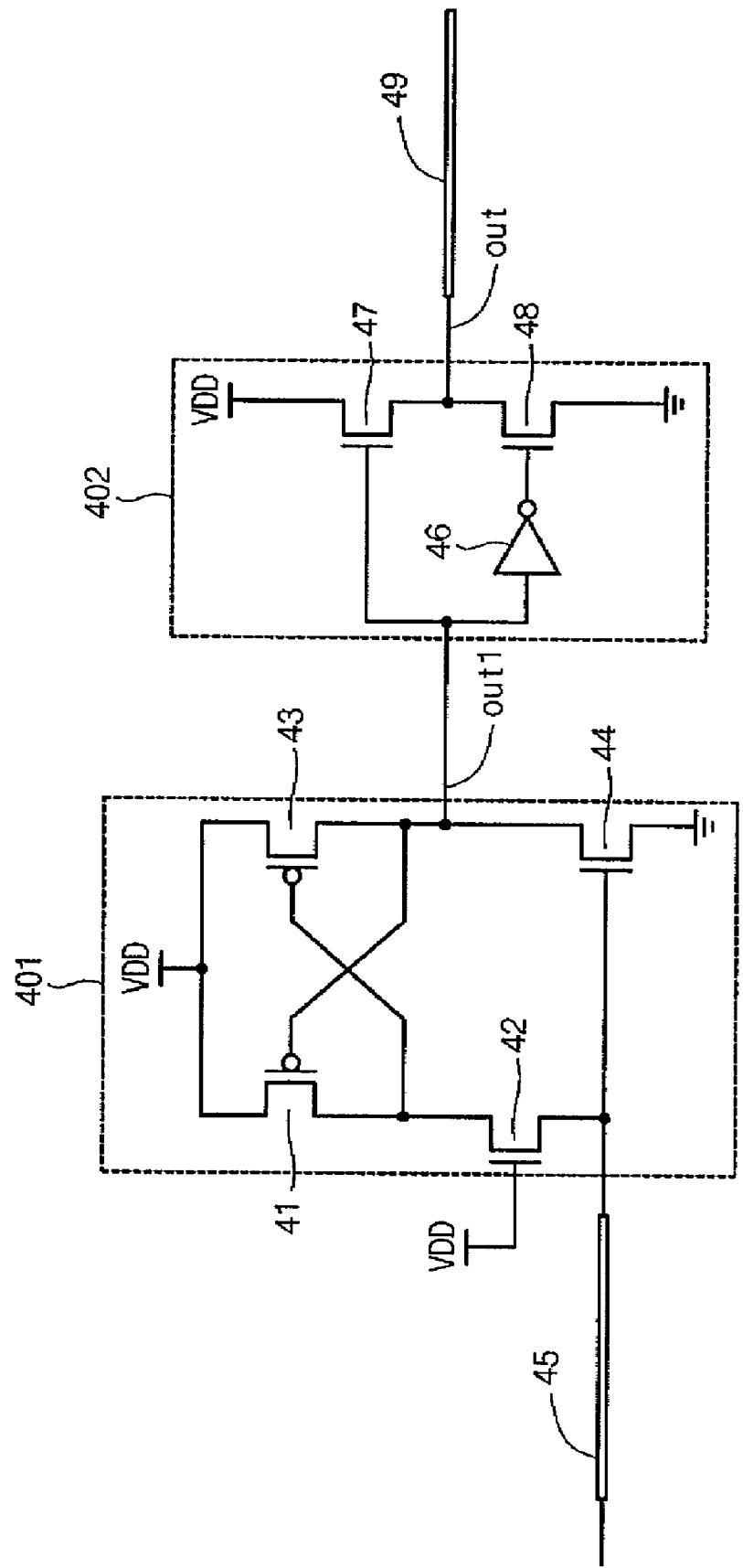
FIG. 4 is a circuit diagram illustrating a configuration of a line repeater according to an embodiment of the present invention.

FIG. 4 is a circuit diagram illustrating a configuration of a line repeater according to an embodiment of the present invention. As generally known in the art, when a transmission line is long, a data (or signal) transmitted through the transmission line may be influenced by noise. In addition, as a transmission line is longer, the capacitance of the transmission line becomes larger to increase an RC time, which may cause a problem in transmitting a high-frequency signal. In order to solve such a problem, a line repeater is installed in the course of the transmission line. By installing the line repeater as described above, the effect of noise can be reduced, so that it is possible to smoothly transmit high-frequency signals.

As shown in FIG. 4, the line repeater installed between a transmission line 45 and a transmission line 49 includes a receiver 401 and a driver 402.

The receiver 401 includes transistors 41 to 44 and has the same configuration as that of the receiver shown in FIG. 3. That is, the transistors 41 to 44 shown in FIG. 4 correspond to the transistors 31 to 34 shown in FIG. 3, respectively. The transmission line 45 of FIG. 4 corresponds to the transmission line 35 of FIG. 3. In addition, an output node 'out1' of the receiver 401 corresponds to the output node 'out' of FIG. 3.

The driver 402 includes two NMOS transistors 47 and 48 connected in series between a supply voltage 'VDD' and the ground voltage, and an inverter 46. That is, the NMOS transistor 47 is connected between the supply voltage 'VDD' and an output node 'out', and the NMOS transistor 48 is connected between the output node 'out' and the ground.

As shown in FIG. 4, the output node 'out1' of the receiver 401 is connected to both of the gate of the NMOS transistor 47 and the input node of the inverter 46, which are contained in the driver 402. The output node of the inverter 46 is connected to the gate of the NMOS transistor 48. The output node 'out' of the driver 402 is connected to the transmission line 49. The transmission line 49 is connected to an interior circuit (not shown).

The operation of the line repeater shown in FIG. 4 is as follows.

First, a signal (or data) having a high level 'VDD–Vth' or a ground level is applied to the receiver 401 through the transmission line 45. Corresponding to the applied signal, the receiver 401 outputs a signal of the ground level or the high level 'VDD–Vth' through the output node 'out1'. The driver 402 outputs a signal of the high level 'VDD–Vth' or the ground level in response to the output signal of the receiver 401. Accordingly, a signal transmitted through the transmission line 49 is a signal having a reduced swing width, which is the same signal as that applied through the transmission line 45.

As described above, according to an embodiment of the present invention, the output signal of the driver, which includes two NMOS transistors connected in series between the supply voltage and the ground voltage, is transmitted, so that power consumption of the semiconductor device can be reduced.

In addition, the repeater according to the present invention is installed in the course of a transmission line, so that it is possible to smoothly transmit high-frequency signals.

Although a preferred embodiment of the present invention has been described for illustrative purposes, those skilled in the art will appreciate that various modifications, additions and substitutions are possible, without departing from the scope and spirit of the invention as disclosed in the accompanying claims.

I claim:

1. A line driving circuit of a semiconductor device, the line driving circuit comprising:
    a driving unit reducing a full voltage swing width to output a signal to a first node, the driving unit comprising:
        a first NMOS transistor connected between a supply voltage and the first node;
        a second NMOS transistor connected between the first node and ground; and
        a differential amplification unit for generating first and second output signals to be applied to gates of the first and second NMOS transistors, respectively,
        wherein the first and second output signals have a complementary relationship, and the first and second output signals have a voltage level corresponding to a level of the supply voltage or a ground voltage, such that the first and second output signals have the full voltage swing width of the supply voltage to the ground,
    wherein the signal output by the driving unit has a reduced voltage swing width of a voltage level less than the supply voltage to the ground,
    a receiver having transistors connected to form a cross-coupled latch structure, the receiver receiving the signal outputted to the first node having the voltage swing width reduced by the driving unit, and the cross-coupled latch structure being configured to convert the signal back to a signal having the full voltage swing width,
    wherein the first node is connected to an Input node of an interior circuit in the semiconductor device by a transmission line.

2. The line driving circuit as claimed in claim 1, wherein the receiver comprises:
    a first PMOS transistor connected between the supply voltage and a second node;
    a third NMOS transistor connected between the second node and a third node;
    a second PMOS transistor connected between the supply voltage and a fourth node; and
    a fourth NMOS transistor connected between the fourth node and ground,
    wherein the first node is connected to the third node, the second node is connected to a gate of the second PMOS transistor, the fourth node is connected to a gate of the first PMOS transistor, a gate of the third NMOS transistor is connected to the supply voltage, and a gate of the fourth NMOS transistor is connected to the third node.

3. The line driving circuit as claimed in claim 2, wherein the fourth node is connected to an input node of an interior circuit in the semiconductor device.

4. A line driving circuit of a semiconductor device, the line driving circuit comprising:
    a differential amplification unit for generating first and second output signals,
        wherein the first and second output signals have a complementary relationship, and the first and second output signals have a voltage level corresponding to a level of a supply voltage or a ground voltage, such that the first and second output signals have a full voltage swing width from the supply voltage to the ground,
    a first NMOS transistor connected between a supply voltage and a first node;
    a second NMOS transistor connected between the first node and ground;
        wherein the first and second NMOS transistors receive the first and second output signals through their respective gates and output a first signal to the first node, the first signal having a reduced voltage swing width of a voltage less than the supply voltage to the ground voltage,
    a line repeater for receiving and restoring the first signal, the line repeater comprising:
        a receiver having transistors connected to form a cross-coupled latch structure, the receiver receiving the first signal from the first node and the cross-coupled latch structure being configured to convert the received signal to a second signal having the full voltage swing width of the supply voltage to the ground voltage;

a driver receiving the second signal from the receiver and reducing the swing width to output a third signal having a restored swing width of the voltage less than the supply voltage to the ground voltage.

5. The line driving circuit as claimed in claim 4, further comprising:
   a first transmission line connecting the first node to the line repeater; and
   a second transmission line for receiving the signal outputted from the line repeater.

6. The line driving circuit as claimed in claim 5, wherein the second transmission line is connected to an input node of an interior circuit in the semiconductor device.

7. The line driving circuit as claimed in claim 4, wherein the receiver comprises:
   a first PMOS transistor connected between the supply voltage and a second node;
   a third NMOS transistor connected between the second node and a third node;
   a second PMOS transistor connected between the supply voltage and a fourth node; and
   a fourth NMOS transistor connected between the fourth node and ground,
   wherein the first node is connected to the third node, the second node is connected to a gate of the second PMOS transistor, the fourth node is connected to a gate of the first PMOS transistor, a gate of the third NMOS transistor is connected to the supply voltage, and a gate of the fourth NMOS transistor is connected to the third node,
   wherein the driver comprises: a fifth NMOS transistor connected between the supply voltage and a fifth node; and a sixth NMOS transistor connected between the fifth node and ground,
   wherein an output voltage of the fourth node is applied complementary to gates of the fifth NMOS transistor and sixth NMOS transistor.

* * * * *